US009267992B2

(12) United States Patent
Shiraishi et al.

(10) Patent No.: US 9,267,992 B2
(45) Date of Patent: Feb. 23, 2016

(54) SWITCH FAILURE DIAGNOSIS DEVICE AND ELECTRIC STORAGE APPARATUS

(71) Applicant: GS Yuasa International Ltd., Kyoto-shi (JP)

(72) Inventors: Takeyuki Shiraishi, Kyoto (JP); Tomohiro Kawauchi, Kyoto (JP); Takeshi Itagaki, Kyoto (JP); Tomoshige Inoue, Kyoto (JP); Daisuke Konishi, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 171 days.

(21) Appl. No.: 13/961,570

(22) Filed: Aug. 7, 2013

(65) Prior Publication Data

US 2013/0320986 A1 Dec. 5, 2013
US 2014/0176140 A9 Jun. 26, 2014

(30) Foreign Application Priority Data

Aug. 10, 2012 (JP) ................................. 2012-178364

(51) Int. Cl.
G01R 31/327 (2006.01)
G01R 31/00 (2006.01)
H02J 7/00 (2006.01)
H01H 47/00 (2006.01)

(52) U.S. Cl.
CPC .......... *G01R 31/327* (2013.01); *G01R 31/3275* (2013.01); *G01R 31/006* (2013.01); *H01H 47/002* (2013.01); *H02J 7/0029* (2013.01)

(58) Field of Classification Search
CPC .................................................... G01R 31/3624
USPC .................................................. 324/430–437
See application file for complete search history.

(56) References Cited

U.S. PATENT DOCUMENTS 8,497,715 B2 7/2013 Kanayama
2008/0111556 A1* 5/2008 Yano .............................. 324/433
2012/0161822 A1 6/2012 Kanayama

FOREIGN PATENT DOCUMENTS

JP 2007-285969 A 11/2007
JP 2011-229216 A 11/2011
JP 2012-138831 A 7/2012

* cited by examiner

*Primary Examiner* — Vincent Q Nguyen
(74) *Attorney, Agent, or Firm* — McGinn IP Law Group, PLLC.

(57) ABSTRACT

A switch failure diagnosis device for using in a current path between an electric device and an electric storage device includes plural switches, a switch terminal voltage detector, and a controller. The switches are connected parallel to each other in the current path. The switch terminal voltage detector outputs a switch terminal voltage detection signal. The controller is configured to: select the switches at different time in sequence and input an open instruction signal to each switch at the time when the switch is selected; and determine, based on the switch terminal voltage detection signal output while the open instruction signal is given, that at least one of the switches has a failure if the detected voltage is in a failure determination range.

20 Claims, 7 Drawing Sheets

SWITCH FAILURE DIAGNOSIS DEVICE AND ELECTRIC STORAGE APPARATUS

CROSS-REFERENCE TO RELATED APPLICATIONS

This application claims priority from Japanese Patent Application No. 2012-178364 filed on Aug. 10, 2012. The entire content of this priority application is incorporated herein by reference.

FIELD

Technologies described herein relates to determination whether failures of switches that are provided for shutting off a charge current or a discharge current exist.

BACKGROUND

Conventionally, there is a power supply control device including a plurality of switching elements connected parallel to each other between a battery and a load, and is configured to detect a failure of any one of the switching elements (see JP-A-2011-229216). Specifically, the power supply control device measures voltages at terminals of the switching elements on the load side while the switching elements are individually opened and while the switching elements are opened at the same time (open state). Then, the power supply control device detects a failure of each switching element based on the measured voltages. Such a failure of the switching element includes a close failure in which the switching element remains closed (close state) even when an open instruction signal for opening the switching element is input.

According to the above conventional technology, all switching elements need to be opened at the same time to determine whether failures of switches exist. Therefore, a current path between the battery and the load is shut off.

This specification describes a technology for determining whether a failure of switch exists without shutting off a current path between an electric storage device and an electric device such as a load and a charger.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified foim as a prelude to the more detailed description that is presented later.

A switch failure diagnosis device described in this specification is for using in a current path between an electric device and an electric storage device. The switch failure diagnosis device includes a plurality of switches, a switch terminal voltage detector, and a controller. The switches are connected parallel to each other in the current path between the electric device and the electric storage device. The switch terminal voltage detector is configured to output a switch terminal voltage detection signal corresponding to a voltage across the switches. The controller is configured to: select the switches at different time in sequence and input an open instruction signal to each switch at the time when the switch is selected; and determine, based on the switch terminal voltage detection signal output while the open instruction signal is given, that at least one of the switches has a failure if the detected voltage is in a failure determination range.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
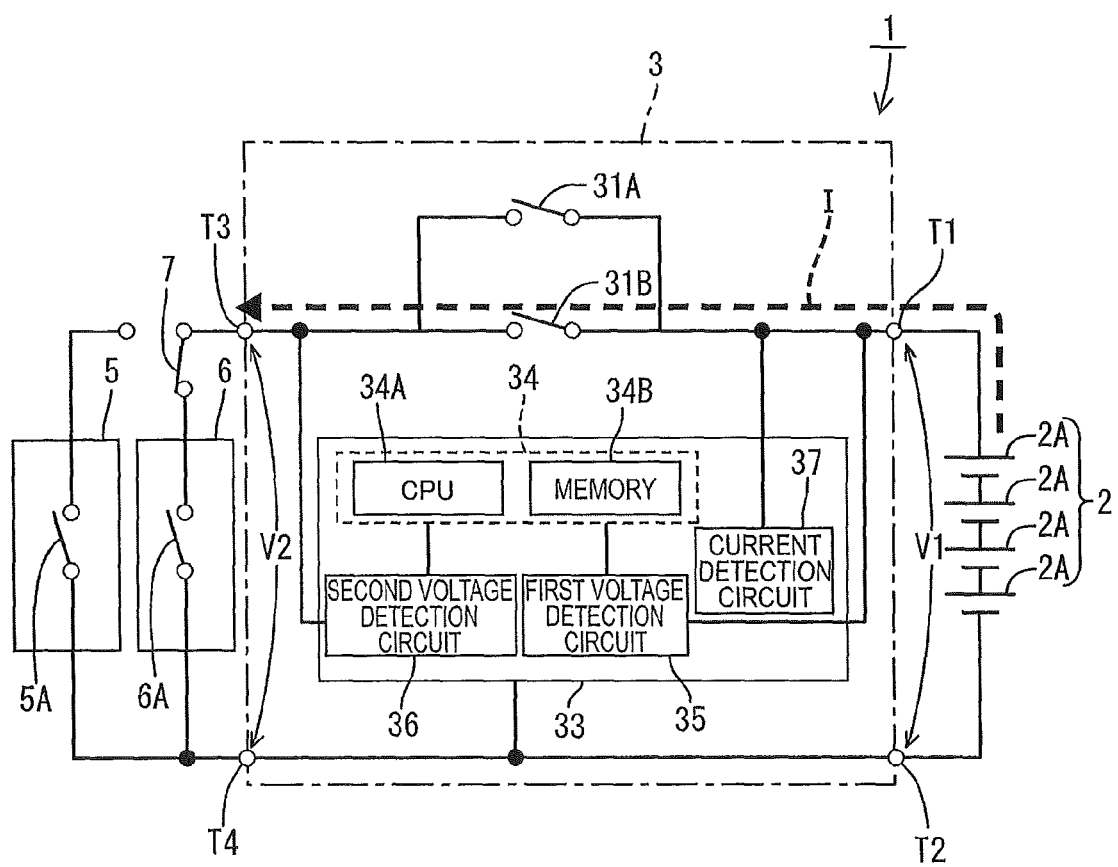
FIG. 1 is a block diagram illustrating an electric configuration of a battery pack according to an embodiment.
Figure 2:
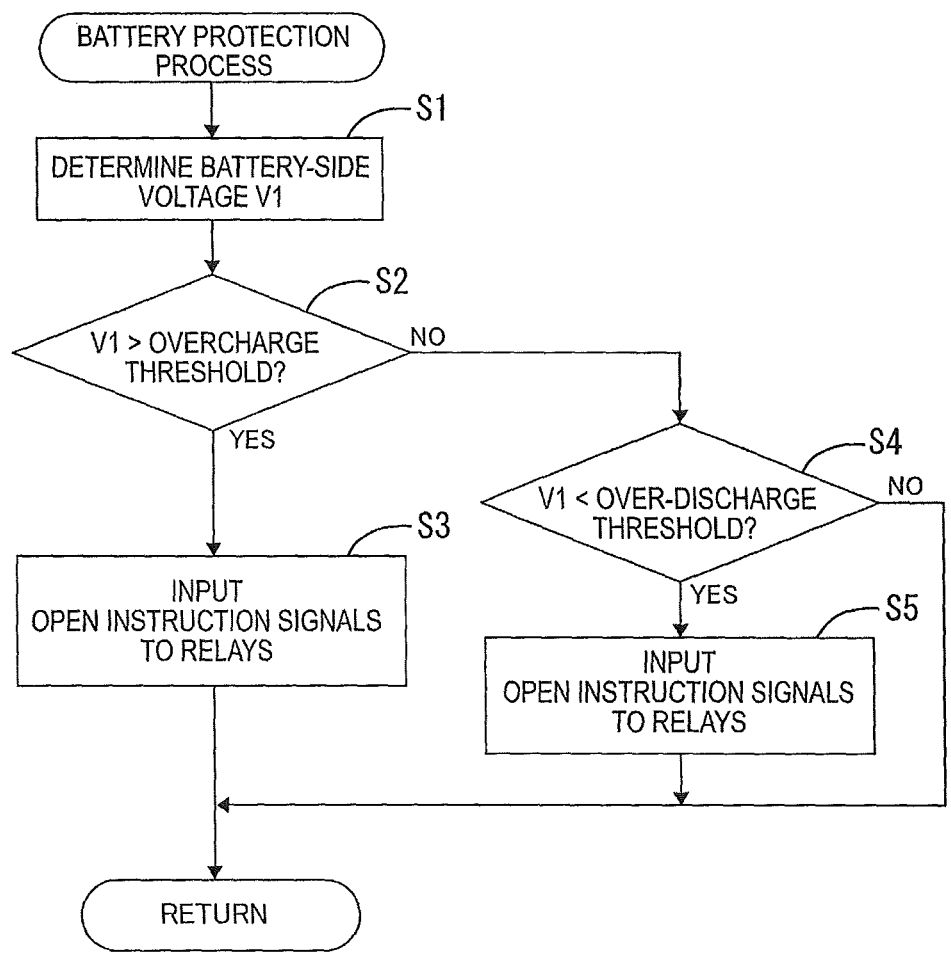
FIG. 2 is a flowchart illustrating a battery protection process.

According to a first aspect, there is provided a switch failure diagnosis device for using in a current path between an electric device and an electric storage device, the switch failure diagnosis device including: a plurality of switches connected parallel to each other in the current path between the electric device and the electric storage device; a switch terminal voltage detector configured to output a switch terminal voltage detection signal corresponding to a voltage across the switches; and a controller configured to: select the switches at different time in sequence and input an open instruction signal to each switch at the time when the switch is selected; and determine, based on the switch terminal voltage detection signal output while the open instruction signal is given, that at least one of the switches has a failure if the detected voltage is in a failure determination range.

In the switch failure diagnosis device according to the first aspect, the voltage across the plurality of switches, which is measured while an open instruction signal is input to at least one of the switches, varies according to whether the at least one of the switches has a failure. In the switch failure diagnosis device, the switches are selected at different time in sequence and an open instruction signal is input to each switch at the time when the switch is selected. If the voltage across the switches measured while the open instruction signal is input is within a failure determination range, it is determined that the switch has a failure. The switch failure can be determined without shutting off the current path between the electric storage device and the electric device such as a load and a charger.

According to a second aspect, the controller is further configured to: determine whether the electric device is in an energized state or a non-energized state; perform the determining whether at least one of the switches has a failure if the electric device is determined to be in the non-energized state; and perform the inputting the open instruction signal to the switch and the determining whether at least one of the switches has a failure if the electric device is determined to be in the energized state and no failure of switches is determined while the electric device is in the non-energized state.

In the switch failure diagnosis device according to the second aspect, open instruction signals are input to the switches and failure determination is performed if the electric device is determined to be in the energized state and no failure of the switches is determined while the electric device is in the non-energized state. With this configuration, shutting off of the current path between the electric storage device and the electric device such as a load and a charger, which conventionally is performed by inputting an open instruction signal even though a switch failure is detected during the electric device is in the non-energized state, can be prevented.

According to a third aspect, the switch terminal voltage detector includes an electric device-side voltage detector portion configured to output an electric device-side voltage detection signal corresponding to an electric device-side voltage that is a voltage between the electric device and the switches, and the controller is configured to: perform the inputting the open instruction signal to the switch if the electric device is determined to be in the non-energized state; determine the electric device-side voltage based on the electric device-side voltage detection signal while the open instruction signal is given to the switch; and determine that there is no failure of switch if the electric device-side voltage is equal to or higher than a failure determination threshold.

According to a fourth aspect, the switch terminal voltage detector includes an electric device-side voltage detector portion and an electric storage device-side voltage detector portion, the electric device-side voltage detector portion being configured to output an electric device-side voltage detection signal corresponding to an electric device-side voltage that is a voltage between the electric device and the switches, the electric storage device-side voltage detector portion being configured to output an electric storage device-side voltage detection signal corresponding to an electric storage device-side voltage that is a terminal voltage of the electric storage device, and the controller is configured to determine whether at least one of the switches has a failure based on a difference between the electric device-side detection signal and the electric storage device-side detection signal.

In the switch failure diagnosis device according to the third aspect, the open instruction signal is input to the switch and failure determination is performed if the electric device is determined to be in the non-energized state and an electric device-side voltage detected during the electric device is in the non-energized state is equal to or higher than a failure determination threshold. With this configuration, the switch failure diagnosis device can determine switch failures during the electric device is in the non-energized state without using an external device.

According to a fifth aspect, the controller is configured to halt the input of the open instruction signal to the switches without inputting the open instruction signal to an N+1th switch if at least one of the switches is determined to have a failure; and select the N+1th switch and input the open instruction signal to the N+1 th switch if no failure of switches is determined, where N refers to a positive integer equal to or larger than 1.

In the switch failure diagnosis device according to the fifth aspect, the inputs of open instruction signals are halted without inputting the open instruction signal to the N+1th switch if a switch failure is detected. In comparison to a configuration in which the open instruction signals are input to all switches and then the failure determination is performed after the inputs of the open instruction signals are complete, unnecessary inputs of the open instruction signals are not performed.

According to a sixth aspect, the controller is further configured to: determine whether a continue condition is satisfied; and repeat the selecting of the switches and the inputting of the open instruction signal from the first switch if the continue condition is determined as not satisfied during the inputs of the open instruction signals to the switches.

In the switch failure diagnosis device according to the sixth aspect, the selecting of the switches and the inputting of the open instruction signal and the determining of whether the at least one of the switches has a failure are repeated from the first switch if the predefined continue condition is determined as not satisfied during the inputs of the open instruction signals to the switches. With this configuration, switch failures can be more accurately determined in comparison to a configuration in which the selecting of the switches and the inputting of the open instruction signal and the determining of whether the at least one of the switches has a failure are continued even when the continue condition is no longer satisfied.

According to a seventh aspect, the current path includes a plurality of current paths provided with the plurality of switches, respectively, the plurality of current paths includes common connection points on an upstream side of the switches and on a downstream side of the switches, respectively, and the current paths have substantially the same resistance.

The switch failure diagnosis device according to the seventh aspect, the current paths have substantially the same resistance. If the switches have no failures, the amount of current flowing in the circuit does not vary when the switches are alternately opened. Therefore, a voltage difference between the upstream side of the switches and the downstream side thereof does not vary. With this configuration, erroneous switch failure detection is less likely to occur.

With the switch failure diagnosis device according to the above aspects, an electric storage apparatus, in which switch failures can be detected without shutting off the current path between the electric storage device and the electric device, can be provided.

A battery pack 1 according to an embodiment will be described with reference to FIGS. 1 to 7D. The battery pack 1 includes a secondary battery 2 and a battery protection device 3. The battery pack 1 is to be installed in an electric vehicle or a hybrid vehicle, for example, to supply power to various on-board devices. The battery pack 1 is an example of an electric storage apparatus and may be a battery module. The secondary battery 2 is an example of an electric storage device. A capacitor may be used as an electric storage device instead of the secondary battery 2. The battery protection device 3 is an example of a switch failure diagnosis device.

Electric Configuration of Battery Pack

As illustrated in FIG. 1, the secondary battery 2 is a lithium ion battery, for example, which is an assembled battery including four cells 2A connected in series. The secondary battery 2 may include a single cell 2A or two cells 2A connected in series. Alternatively, the secondary battery 2 may include three cells 2A or five or more cells 2A connected in series.

The battery protection device 3 includes connection terminals T1 to T4, a first relay 31A, a second relay 31B, and a battery monitoring unit 33. The secondary battery 2 is connected between the connection terminals T1 and T2. A charger 5 (an external charger or an on-board charging circuit) and a load 6 (e.g., a headlight unit), which are electric devices, are selectively connected between the connection terminals T3 and T4 via a selector switch 7. When a power switch, which is not illustrated, of the charger 5 is set to on by a user, a charger switch 5A illustrated in FIG. 1 switches the state thereof from an open state to a closed state. As a result, a state of the charger 5 changes from a non-energized state to an energized state. When an ignition key is turned on by a user, open and close of a load switch 6A is controlled by an on-board electronic control unit (ECU), which is not illustrated. As a result, a state of the load 6 changes from a non-energized state to an energized state.

The relays 31 are connected parallel to each other in a current path between the connection terminal T1 and the connection terminal T3. Each of the relays 31A and 31B is a contact relay (a mechanical switch). When the relay 31A or 31B receives an open instruction signal, which will be described later, the relay 31A or 31B mechanically opens due to electromagnetic effects such that one of contacts thereof is out of contact with the other one of the contacts (i.e. the relay 31A or 31B enters an open state or an off state). When the relay 31A or 31B receives a close instruction signal, which will be described later, the 31A or 31B mechanically closes due to electromagnetic effects such that the one of the contacts is in contact with the other one (i.e., the relay 31A or 31B enters a closed state or an on state). The relays 31A and 31B in the closed states have substantially the same contact resistance. The relays 31A and 31B are examples of switches.

The battery monitoring unit 33 includes a controller 34, a first voltage detection circuit 35, a second voltage detection circuit 36, and a current detection circuit 37. The controller 34 includes a central processing unit (hereinafter referred to as the CPU) 34A and a memory 34B. The memory 34B stores various programs for controlling operations of the battery monitoring unit 33. The CPU 34A reads the programs out of the memory 34B and controls the circuits and components of the battery monitoring unit 33 according to the programs read out of the memory 34B. The memory 34B includes a RAM and a ROM. A storage medium that stores the programs may be a non-volatile memory such as a CD-ROM, a hard disk drive, and a flash memory.

The first voltage detection circuit 35 outputs a detection signal corresponding to a voltage between the connection terminal T1 and the connection terminal T2 to the controller 34. This voltage is a terminal voltage of the secondary battery 2 and hereinafter referred to as a battery-side voltage V1. The second voltage detection circuit 36 outputs a detection signal corresponding to a voltage between the connection terminal T3 and the connection terminal T4 to the controller 34. This voltage is proportional to an output voltage of the charger 5 or a voltage across the load 6 in the energized state and hereinafter referred to as an electric device-side voltage V2. The controller 34 detects a voltage difference between the battery-side voltage V1 and the electric device-side voltage V2 as a relay terminal voltage V3. The relay terminal voltage V3 is a voltage across a plurality of the relays 31A and 31B. The first voltage detection circuit 35 and the second voltage detection circuit 36 are an example of a switch terminal voltage detector. The second voltage detection circuit 36 is an example of an electric device-side voltage detection circuit. The current detection circuit 37 outputs a current detection signal to the controller 34. The current detection signal corresponds to an amount of current I flowing through the current path between the connection terminal T1 and the connection terminal T3. The detection signals may be analog signals or digital signals.

Control of Battery Monitoring Unit

1. Battery Protection Process

When the battery protection device 3 is turned on, the CPU 34A inputs close instruction signals to the relays 31A and 31B to close the relays 31A and 31B. As a result, the relays 31A and 31B close and currents flow from the secondary battery 2 to the load 6, that is, power is supplied to the load 6 (see FIG. 1). The CPU 34A reads the relevant program out of the memory 34B and executes a battery protection process illustrated in FIG. 2.

In the battery protection process, the CPU 34A continuously or periodically detects the battery-side voltage V1 based on a detection signal from the first voltage detection circuit 35 (S1). The CPU 34A determines whether the battery-side voltage V1 is higher than an overcharge threshold (S2) and whether the battery-side voltage V1 is lower than an over-discharge threshold (S4). The preferable overcharge threshold is slightly lower than the battery-side voltage V1 measured when the secondary battery 2 is in an overcharge state. The preferable over-discharge threshold is slightly higher than the battery-side voltage V1 measured when the secondary battery 2 is in an over-discharge state. The overcharge threshold and the over-discharge threshold can be defined based on results of experiments in which the battery-side voltages V1 are detected while the second battery 2 is set in an overcharge state and while the second battery 2 is set in an over-discharge state.

If the battery-side voltage V1 is higher than the overcharge threshold (YES in step S2), the secondary battery 2 may enter into an overcharge state. Therefore, the CPU 34A executes an overcharge control step in which the CPU 34A inputs open instruction signals to the relays 31A and 31B (S3) to open the relays 31A and 31B. As a result, the relays 31A and 31B open and the charge of the secondary battery 2 stops. With this step, the secondary battery 2 is less likely to enter into the overcharge state. When the overcharge control step is complete, the CPU 34A returns to step S1.

If the battery-side voltage V1 is equal to or lower than the overcharge threshold (NO in step S2), the CPU 34A determines whether the battery-side voltage V1 is lower than the over-discharge threshold (S4). If the battery-side voltage V1 is lower than the over-discharge threshold (YES in step S4), the secondary battery 2 may enter into an over-discharge state. Therefore, the CPU 34A executes an over-discharge control step in which the CPU 34A inputs open instruction signals to the relays 31A and 31B (S5). As a result, the relays 31A and 31B open and the discharge of the secondary battery 2 stops. With this step, the secondary battery 2 is less likely to enter into the over-discharge state. When the over-discharge control step is complete, the CPU 34A returns to step S1.

If the battery-side voltage V1 is equal to or lower than the overcharge threshold (NO in step S2) and equal to or higher than the over-discharge threshold (NO in step S4), the CPU 34A returns to step S1 while continues inputting the close signal to the relays 31A and 31B.

2. Switch Failure Diagnosis Process

Figure 3:
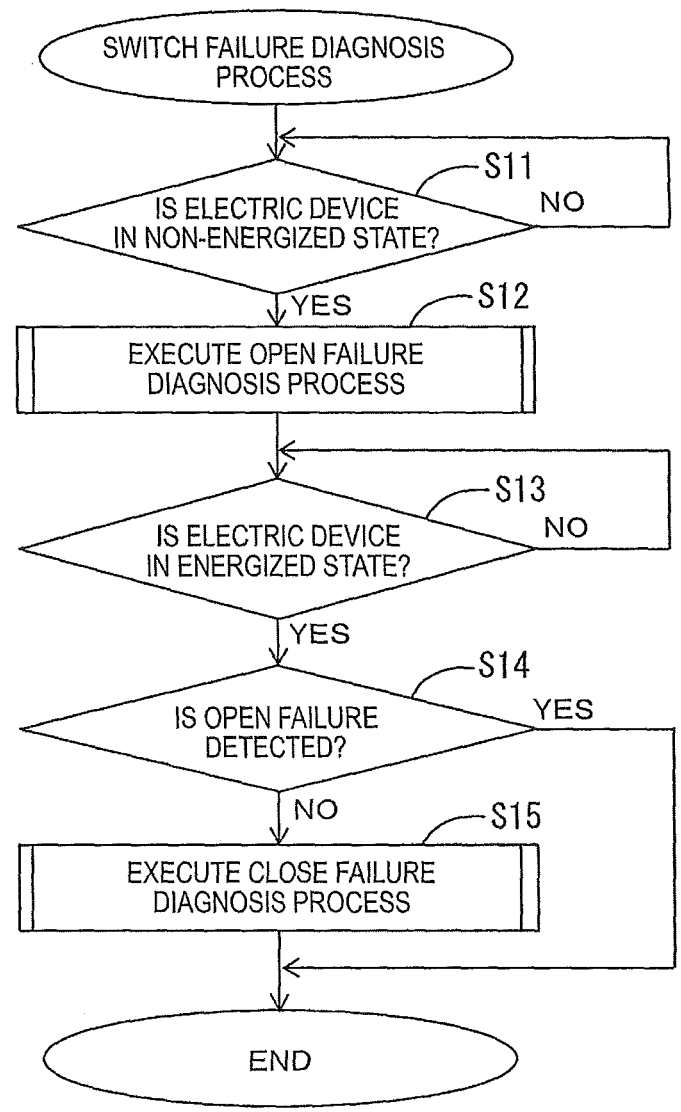
FIG. 3 is a flowchart illustrating a switch failure diagnosis process.

If the relays 31A and 31B are all closed and a predetermined condition is satisfied, the CPU 34A executes a switch failure diagnosis process illustrated in FIG. 3. Examples of the predetermined condition include a condition in which a vehicle is powered up through operation of an ignition key by a user and a condition in which a predetermined time has elapsed since execution of the previous failure diagnosis process. A program for executing the switch failure diagnosis process is an example of a switch failure diagnosis program.

Operations of the CPU 34A are practically the same in the case that the charger 5 is connected and in the case that the load 6 is connected. In the following description, the term an electric device is used for the charger 5 and the load 6 to indiscriminatingly describe the switch failure diagnosis process in the case that the charger 5 is connected and in the case that the load 6 is connected.

The CPU 34A executes a device state determination step in which whether an electric device is in the non-energized state is determined (S11). For example, the CPU 34A determines whether the electric device is in the energized state or in the non-energized state based on information on open and closed states of the charger switch 5A and the load switch 6A from the ECU that controls the open and close of the switches 5A and 6A or from the electric device. If the switches 5A and 6A are semiconductor switches, a minute current such as a dark current may flows even when the semiconductor switches are open. This situation is also included in the non-energized state. The battery monitoring unit 33 may be in operation with power supplied by the secondary battery 2. This situation is also included in the non-energized state if the switches 5A and 6A are open.

Figure 4:
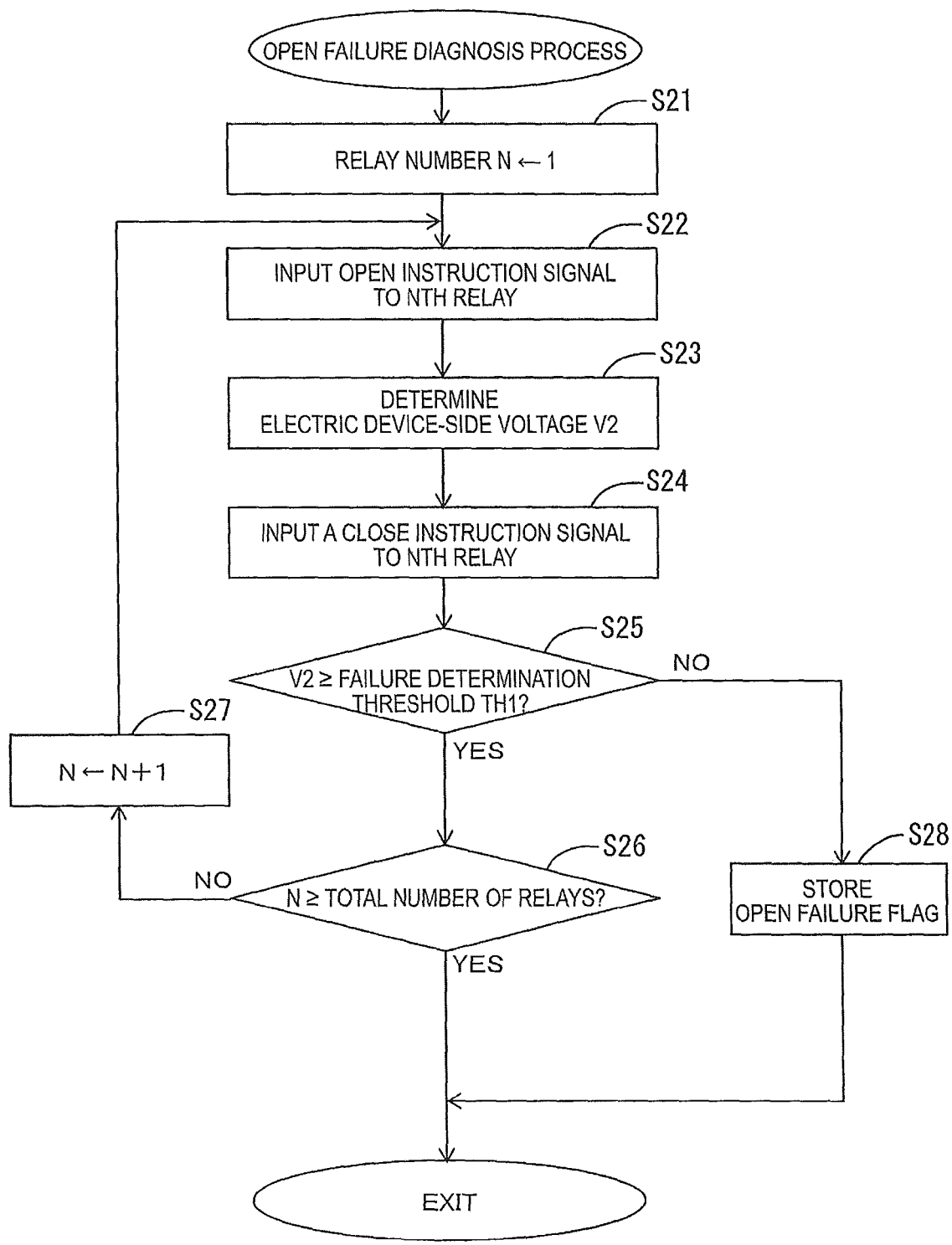
FIG. 4 is a flowchart illustrating an open failure diagnosis process.
Figure 5:
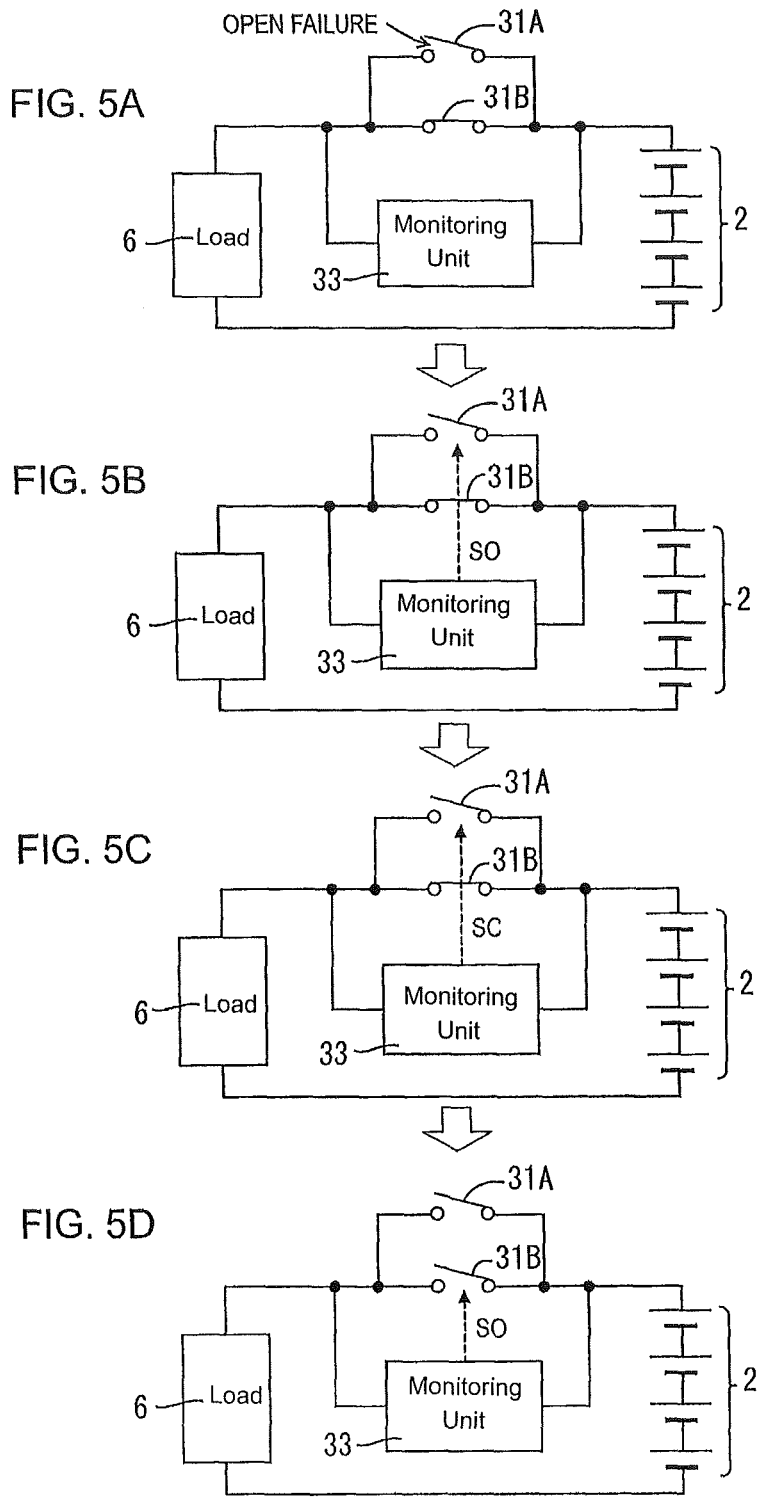
FIGS. 5A to 5D are block diagrams illustrating states of relays, one of which has an open failure.
Figure 6:
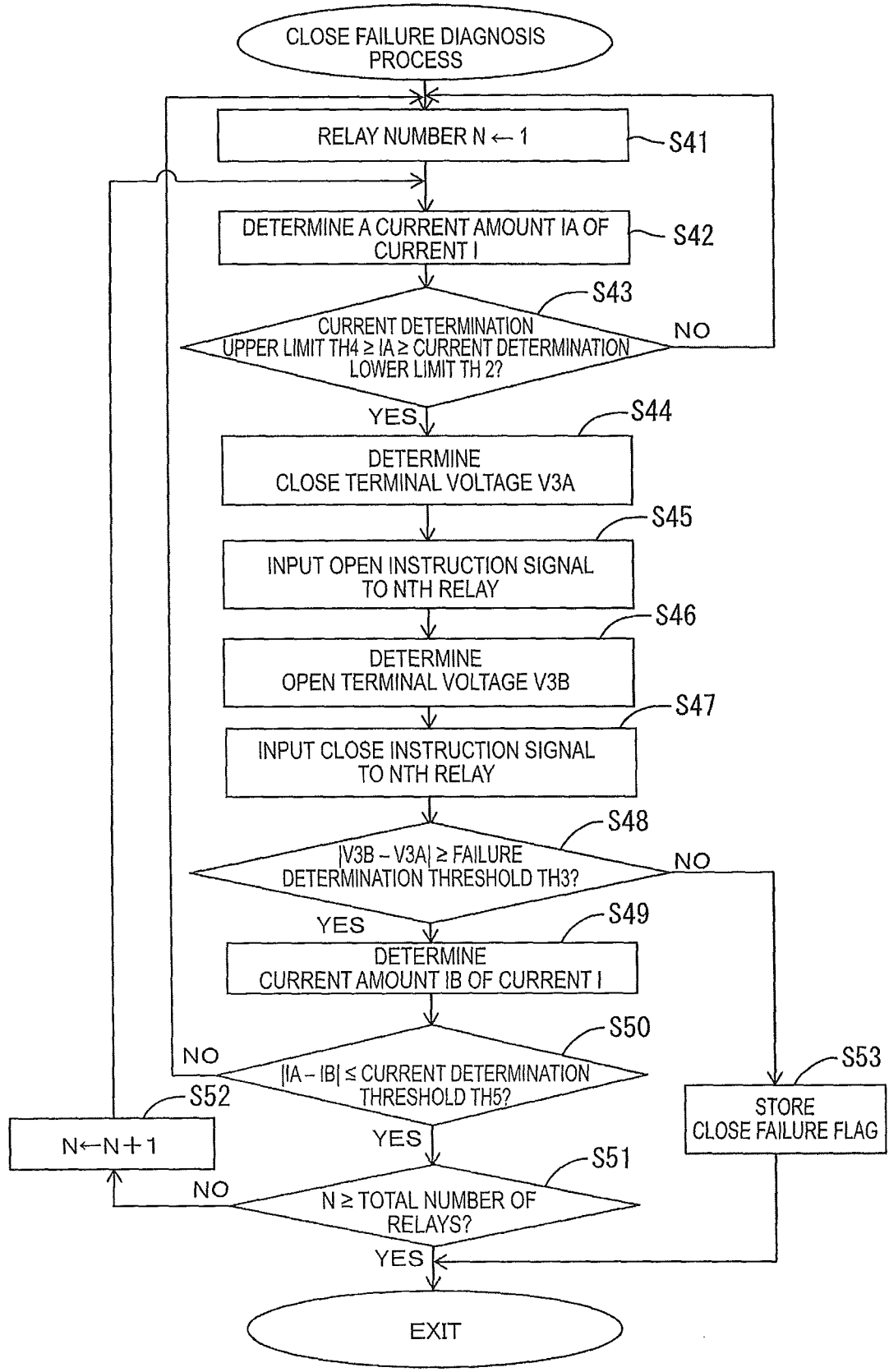
FIG. 6 is a flowchart illustrating a close failure diagnosis process.

If the electric device is in the non-energized state (YES in step S11), the CPU 34A executes an open failure diagnosis process (S12) illustrated in FIG. 4. The open failure diagnosis process is for determining whether any one of the relays 31A and 31B has an open failure. If the relay 31A or 31B remains open even when a close instruction signal is input due to a failure of a coil that drives the relay 31A or 31B or for some reasons, it is determined that the relay 31A or 31B has an open failure. The open failure is an example of switch failures.

2-1. Open Failure Diagnosis Process

The relays 31A and 31B are identified by the relay number N to which a positive integer larger than 1 is assigned. The CPU 34A sets the relay number N to 1, that is, initializes the relay number N (S21), and exclusively inputs an open instruction signal to the Nth relay of the relays 31A and 31B (S22). Then, the CPU 34A detects the electric device-side voltage V2 (S23) and inputs a close instruction signal to the Nth relay (S24).

As described earlier, the electric device is in the non-energized state during the open failure diagnosis process. If the open instruction signal is input to the Nth relay and the relay other than the Nth relay remains properly closed, that is, the relay other than the Nth relay does not have an open failure, the electric device-side voltage V2 is equal to the terminal voltage of the secondary battery 2, that is, equal to the battery-side voltage V1. If the relay other than the Nth relay is open, that is, the relay other than the Nth relay has an open failure, the electric device-side voltage V2 is lower than the voltage measured when the relay other than the Nth relay is properly closed.

The CPU 34A determines whether the electric device-side voltage V2 is equal to or higher than a failure determination threshold TH1 (S25). Step S25 is an example of determination of whether at least one of the switches has a failure if the electric storage device is in the non-energized state. With this step, the battery protection device 3 can determine whether the relays 31A and 31B have failures when the electric device is in the non-energized state without using an external device. It is preferable that the CPU 34A is configured to detect the battery-side voltage V1 and to set a voltage slightly lower than the battery-side voltage V1 as the failure determination threshold TH1 in step S22. The CPU 34A may be configured to determine the electric device-side voltage V2 before inputting the open instruction signal to the Nth relay and to set a voltage slightly lower than the electric device-side voltage V2 as the failure determination threshold TH1. If the electric device-side voltage V2 is equal to or higher than the failure determination threshold TH1 (YES in step S25), it is deteimined that the relay other than the Nth relay does not have an open failure. The CPU 34A determines whether the relay number N has reached a total number (=2) of the relays 31A and 31B (S26).

If the relay number N has reached the total number (YES in step S26), it is determined that all relays 31A and 31B do not have open failures. Therefore, the CPU 34A terminates the open failure diagnosis process and proceeds to step S13. If the relay number N has not reached the total number (NO in step S26), the CPU 34A increments the relay number N by 1 (S27) and returns to step S22.

If the electric device-side voltage V2 is lower than the failure determination threshold TH1 (NO in step S25), the relay other than the Nth relay have an open failure. The CPU 34A stores an open failure flag indicating the open failure in the memory 34B (S28). Then, the CPU 34A terminates the open failure diagnosis process and proceeds to step S13. It is preferable that the CPU 34A is configured to execute an error procedure such as an output of notification signal indicating that the relay other than the Nth relay has the open failure to the external device such as the ECU if the open failure is determined. The CPU 34A may be configured to store the open failure flag in the memory 34B or to execute the error procedure if the electric device-side voltage V2 is determined lower than the failure determination threshold TH1 (NO in step S25) for predetermined times (e.g., 3 times).

An example in which the first relay 31A of the battery pack 1 has an open failure is illustrated in FIGS. 5A to 5D. The charger 5 is omitted in FIGS. 5A to 5D. A first state C1 of the battery pack 1 that includes the first relay 31A having the open failure before an open instruction signal SO is input to the first relay 31A by the CPU 34A is illustrated in FIG. 5A. A second state C2 of the battery pack 1 after the open instruction signal SO is input to the first relay 31A by the CPU 34A (S22) is illustrated in FIG. 5B. Because the first relay 31A has the open failure, the second state C2 of the battery pack 1 is the same as the first state C1.

The CPU 34A inputs a close instruction signal SC to the first relay 31A of the battery pack 1 in the second state C2 (S24). A third state of the battery pack 1 after the close instruction signal SC is input to the first relay 31A by the CPU 34A is illustrated in FIG. 5C. Because the first relay 31A has the open failure, the third state C3 is the same as the first state C1. The CPU 34A determines that the electric device-side voltage V2 is equal to or higher than the failure determination threshold TH1 (YES in step S25), that is, it is determined that the second relay 31B does not have an open failure.

The CPU 34A inputs an open instruction signal SO to the second relay 31B of the battery pack 1 in the third state C3 (S22). A fourth state C4 of the battery pack 1 after the open instruction signal SO is input to the second relay 31B by the CPU 34A is illustrated in FIG. 5D. Because the second relay 31B does not have an open failure, the second relay 31B changes the state thereof from the closed state to the open state. The first relay 31A and the second relay 31B are both in the open state. Therefore, the load 6 is electrically disconnected from the secondary battery 2. The electric device-side voltage V2 of the battery pack 1 in the fourth state C4 after the open instruction signal SO is input to the second relay 31B is lower than the failure determination threshold TH1, that is, it is determined that the first relay 31A has an open failure. The CPU 34A stores an open failure flag in the memory 34B (S28), and terminates the open failure diagnosis process.

The CPU 34A determines whether the electric device is in the energized state (S13). If the electric device is in the energized state (YES in step S13), the CPU 34A determines whether the open failure flag is stored in the memory 34B, that is, whether the open failure is detected in the open failure diagnosis process (S14). If the open failure is not detected (NO in step S14), the CPU 34A executes a close failure diagnosis process (S15) illustrated in FIG. 6. The close failure diagnosis process is for determining whether any one of the relays 31A and 31B has a close failure. If the relay 31A or 31B remains closed even when an open instruction signal is input due to welding of the contacts of the relay 31A or 31B or for some reasons, it is determined that the relay 31A or 31B has a close failure. The close failure is an example of switch failures.

2-2. Close Failure Diagnosis Process

The CPU 34A sets the relay number N to 1, that is, initializes the relay number N (S41), and detects a current amount IA of the current I based on the detection signal from the current detection circuit 37 (S42). The CPU 34A determines whether the current amount IA is equal to or larger than a current determination lower limit TH 2 (e.g., 50 A) and equal to or smaller than a current determination upper limit TH4 (e.g., 100 A) (S43). Step S43 is an example of determination of whether a continue condition is satisfied and the conditions used for the determination are examples of continue conditions.

If the current amount IA is smaller than the current determination lower limit TH2, the relay terminal voltage V3 does not significantly vary according to whether the close failure is present or not. Therefore, close failure determination (S48), which will be explained later, may not be accurately performed. If the current amount IA is larger than the current determination upper limit TH4, the contacts of the relays 31 may degrade due to an excessive amount of current.

If the current amount IA is equal to or larger than the current determination lower limit TH2 and equal to or lower than the current determination upper limit TH4 (YES in step S43), it is determined that the close failure determination can be accurately performed. The CPU 34A detects the relay terminal voltage V3 before inputting the open instruction signal to the Nth relay 31 (S44). This determined relay terminal voltage V3 is hereinafter referred to as a close terminal voltage V3A.

The CPU 34A selects the Nth relay and inputs an open instruction signal only to the Nth relay 31 (S45). The CPU 34A detects the relay terminal voltage V3 (S46). This determined relay terminal voltage V3 is hereinafter referred to as an open terminal voltage V3B. The CPU 34A inputs a close instruction signal to the Nth relay 31 (S47). Step S45 is an example of selection of the switches at different time in sequence and input of an open instruction signal to each switch at the time when the switch is selected. The relays 31 are connected in the current paths, respectively, and the current paths have substantially the same resistance. If the relays 31 do not have failures, the amounts of currents flowing in the respective current paths are substantially the same regardless of which relay 31 the CPU 34A inputs the open instruction signal to, and thus the open terminal voltages V3B are substantially the same.

As described earlier, during the execution of the close failure diagnosis process, the electric device is in the energized state. If an open instruction signal is input to the Nth relay 31 and the Nth relay 31 properly opens because the Nth relay 31 does not have a close failure, the open terminal voltage V3B is higher than the close terminal voltage V3A. If the Nth relay 31 is closed because the Nth relay 31 has a close failure, the open terminal voltage V3B is substantially equal to the close terminal voltage V3A.

The CPU 34A determines an absolute value of a difference between the open terminal voltage V3B and the close terminal voltage V3A (=|V3B−V3A|) and determines whether the absolute value is equal to or larger than a failure determination threshold TH3 (S48). Step S48 is an example of determination of voltages across the switches based on switch terminal voltage detection signals output by the switch terminal voltage detector while inputting the open instruction signal is given, that at least one of the switches has a failure if the detected voltage is in the failure determination range. It is preferable to set the failure determination threshold TH3 to a value calculated by multiplying a difference in resistances of the current paths (between the connection terminal T1 and the connection terminal T3) by a current value. The resistances are measured when the Nth relay 31 is closed and when the Nth relay 31 is open. The current value is preferably within a range from the current determination lower limit TH2 to the current determination upper limit TH4. A range between a value larger by the failure determination threshold TH3 than the close terminal voltage V3A and a value smaller by the failure determination threshold TH3 than the close terminal voltage V3A is an example of a failure determination range.

If the absolute value of a difference between the open terminal voltage V3B and the close terminal voltage V3A (=|V3B−V3A|) is equal to or larger than the failure determination threshold TH3 (YES in step S48), it is determined that the Nth relay 31 does not have a close failure. The CPU 34A proceeds to step S50. In step S50, the CPU 34A determines whether the variation in current I is equal to or smaller than a current determination threshold TH5. Specifically, the CPU 34A detects a current amount IB of the current I (S49), and determines an absolute value of a difference between the current amount IA detected in step S42 and the current amount IB detected in step S49 (=|IA−IB|). Then, the CPU 34A determines whether the absolute value is equal to or smaller than the current determination threshold TH5 (e.g., 10 A).

If the absolute value is equal to or smaller than the current determination threshold TH5 (YES in step S50), the variation in current I is relatively small, that is, the variation is less likely to have an adverse effect on the accuracy of the close failure determination. Therefore, the CPU 34A continues the close failure diagnosis process. The CPU 34A determines whether the relay number N has reached the total number of the relays 31 (S51).

If the relay number N has reached the total number (YES in step S51), all of the relays 31 do not have close failures. Therefore, the CPU 34A terminates the close failure diagnosis process and the switch failure diagnosis process. If the relay number N has not reached the total number (NO in step S51), the CPU 34A increments the relay number N by 1 (S52) and returns to step S42.

If the current amount IA is smaller than the current determination lower limit TH2 or larger than the current determination upper limit TH4 (NO in step S43), the close failure determination may not be accurately performed. Therefore, the CPU 34A returns to step S41 and repeats the close failure diagnosis process from the first relay 31.

If the absolute value |IA−IB| is larger than the current determination threshold TH5 (NO in step S50), the variation in current I is relatively large. Therefore, the absolute value of the difference between the open terminal voltage V3B and the close terminal voltage V3A in the case that the relay 31 has a close failure and the absolute value in the case that the relay 31 does not have a close failure are close to each other. Namely, the variation in current I may have an adverse effect on the accuracy of the close failure determination. Therefore, the CPU 34A returns to step S41 and repeats the close failure diagnosis process from the first relay 31.

If the absolute value of a difference between the open terminal voltage V3B and the close terminal voltage V3A (=|V3B−V3A|) is smaller than the failure determination threshold TH3 (NO in step S48), it is determined that the Nth relay 31 has a close failure. The CPU 34B stores a close failure flag in the memory 34B (S53). The CPU 34B terminates the close failure diagnosis process and the switch failure diagnosis process. It is preferable that the CPU 34A is configured to execute an error procedure such as an output of notification signal indicating that the relay 31 other than the Nth relay 31 has the open failure to the external device such as the ECU if the close failure is determined. The CPU 34A may be configured to store the close failure flag in the memory 34B or to execute the error procedure if the absolute value is determined smaller than the failure determination threshold TH3 (NO in step S48) for predetermined times (e.g., 3 times).

Figure 7A:
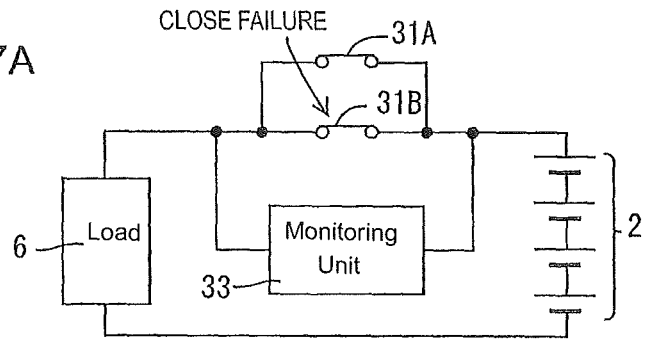
FIGS. 7A to 7D are block diagrams illustrating states of relays, one of which has a close failure.
Figure 7B:
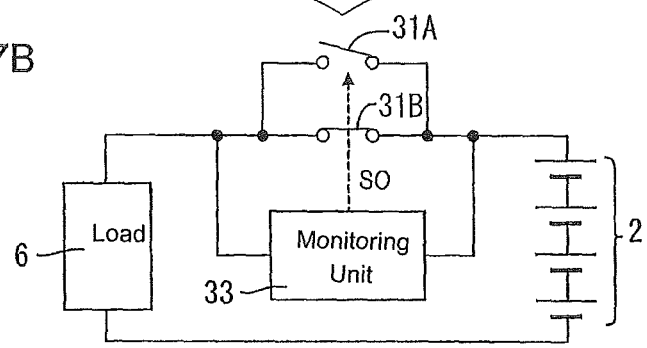

An example in which the second relay 31B of the battery pack 1 has a close failure is illustrated in FIGS. 7A to 7D. The charger 5 is omitted in FIGS. 7A to 7D. A first state C1 of the battery pack 1 that includes the first relay 31A before an open instruction signal is input to the first relay 31A by the CPU 34A is illustrated in FIG. 7A. A second state C2 of the battery pack 1 after the open instruction signal SO is input to the first relay 31A by the CPU 34A (S45) is illustrated in FIG. 7B. Because the first relay 31A does not have the close failure, the state of the first relay 31A changes from the closed state to the open state. Because the first relay 31A is in the open state and the second relay 31B is in the closed state, a voltage between the secondary battery 2 and the load 6 in the second state C2 is higher than that in the first state C1. Therefore, the absolute value of the difference between the open terminal voltage V3B and the close terminal voltage V3A (=|V3B−V3A|) in the second state C2 is larger than the failure determination threshold TH3.

Figure 7C:
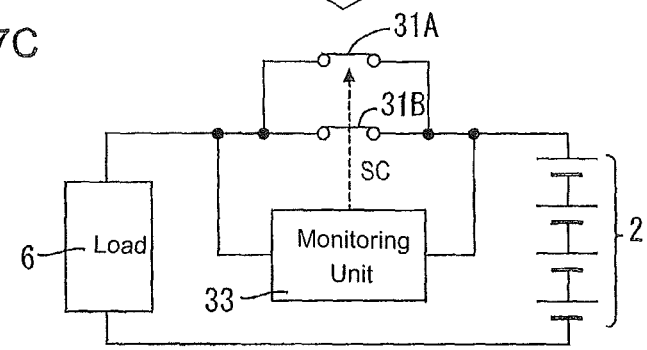

The CPU 34A inputs a close instruction signal SC to the first relay 31A of the battery pack 1 in the second state C2 (S47). A third state C3 of the battery pack 1 after the close instruction signal SC is input to the first relay 31A by the CPU 34A is illustrated in FIG. 7C. Because the first relay 31A does not have a close failure, the third state C3 of the battery pack 1 is the same as the first state C1.

Figure 7D:
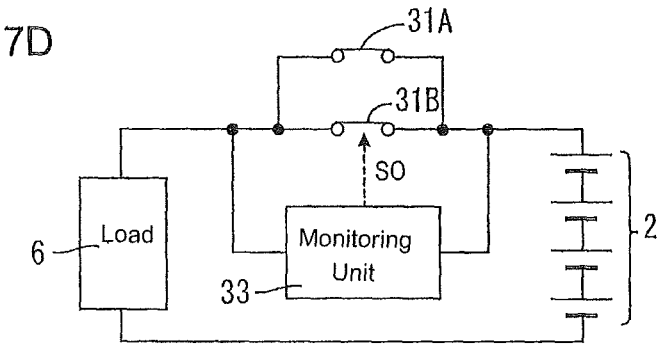

The CPU 34A inputs an open instruction signal SO to the second relay 31B of the battery pack 1 in the third state C3 (S45). A fourth state C4 of the battery pack 1 after the close instruction signal SC is input to the second relay 31B is illustrated in FIG. 7D. Because the second relay 31B has the close failure, the state of the second relay 31B does not change from the close state to the open state. The first relay 31A and the second relay 31B are both in the close states. Therefore, the fourth state C4 of the battery pack 1 is the same as the first state C1. The absolute value of the difference between the open terminal voltage V3B and the close terminal voltage V3A (=|V3B−V3A|) in the fourth state C4 is smaller than the failure determination threshold TH3. In this case, it is determined that the second relay 31B has a close failure and thus the CPU 34A stores a close failure flag in the memory 34B (S53) and terminates the close failure diagnosis process. In the states C1 to C4 illustrated in FIGS. 7A to 7D, if an amount of current I is 100 A and contact resistances of the relays 31A and 31B are 300μΩ, the absolute value (=|V3B−V3A|) is 15 mV when both relays 31A and 31B are in the closed states and 30 mV when one of the relays 31A and 31B is in the closed state.

Effects

According to this embodiment, whether the relays 31A and 31B have failures is determined based on whether the open terminal voltage V3B when an open instruction signal is input to at least one of the relays 31A and 31B is within the failure determination range. Therefore, whether the relays 31A and 31B have failures can be determined while the continuity of the current path between the electric device and the secondary battery 2 is maintained. Namely, during charge of the secondary battery 2 by the charger 5, whether the relays 31A and 31B have failures can be determined without halting the charge of the secondary battery 2. Furthermore, during power supply from the secondary battery 2 to the load 6, whether the relays 31A and 31B have failures can be determined without halting the power supply to the load 6.

If the charger 5 or the load 6 is in the energized state and no failures of the relays 31A and 31B are determined in determination of whether at least one of the relays 31A and 31B has a failure if the secondary battery 2 is in the non-energized state, the inputs of the open instruction signals and the determination of whether the relays 31A and 31B have failures are performed. The current path between the secondary battery 2 and the charger 5 or the load 6 may be shut off if the open instruction signal is input to the relays 31A and 31B even when the failures of the relays 31A and 31B are detected. With the above configuration, such a problem is less likely to occur.

If the Nth relay has a failure, the controller 34 halts the input of the open instruction signal, that is, does not input the open instruction signal to the next (N+1th) relay. With this configuration, unnecessary inputs of the open instruction signals can be reduced in comparison to a configuration in which open instruction signals are input to all relays and a failure determination process is executed after the inputs of the open instruction signals are complete.

If the electric device is in the non-energized state, the controller 34 executes the open failure diagnosis process. If the electric device is in the energized state, the controller 34 executes the close failure diagnosis process based on a condition that no open failure is detected in the open failure diagnosis process. If the CPU 34 executes the close failure diagnosis process without executing the open failure diagnosis process in a condition that the second relay 31B has an open failure as illustrated in FIGS. 5A to 5B, the controller 34 first inputs an open instruction signal to the first relay 31A in the close failure diagnosis process. As a result, both relays 31A and 31B open, and the current path between the secondary battery 2 and the electric device is shut off. However, the shut off of the current path is less likely to occur according to this embodiment.

According to the switch failure diagnosis device, if the electric device is in the non-energized state, the relay terminal voltage of the relays 31A and 31B while the open instruction signals are input may not significantly vary according to whether the relays 31A and 31B have failures. According to this embodiment, the close failure diagnosis process is executed if the energized state of the electric device is determined. In comparison to a configuration in which the close failure diagnosis process is started regardless of whether the electric device is in the non-energized state, the accuracy of determination of whether the relays 31A and 31B have failures is less likely to decrease.

Other Embodiments

The present invention is not limited to the embodiment described above and illustrated in the drawings. The following various embodiments are also included in the technical scope of the present invention.

In the above embodiment, the controller 34 includes a single CPU and a single memory. However, the configuration of the controller 34 is not limited to such a configuration. The controller 34 may include a plurality of CPUs or a hardware circuit such as an application specific integrated circuit (ASIC). The controller 34 may include both hardware circuit and CPU. For example, parts of or entire battery protection process and switch failure diagnosis process may be executed by different CPUs or hardware circuits. The sequence of execution of the processes may be altered as appropriate.

In the above embodiment, the contact relays 31A and 31B are provided as an example of switches. However, the switches are not limited to those. Semiconductor devices such as bipolar transistors and MOSFETs may be used for the switches. Furthermore, normally-closed type switches that are normally closed and open when open instruction signals are input may be used.

In the above embodiment, the battery protection device 3 directly detects the relay terminal voltage V3 of the relays 31A and 31B. However, the configuration of the battery protection device 3 is not limited to such a configuration. The battery protection device 3 may be configured to detect the relay terminal voltage V3 based on a total voltage of the relay terminal voltage V3 and a voltage across resistors connected in series. Namely, the battery protection device 3 can be configured to detect the relay terminal voltage V3 based on a voltage having a correlation with the relay terminal voltage V3.

In the above embodiment, the failure determination thresholds TH1 and TH3 used in the failure determination process vary according to the battery-side voltage V1 and the electric device-side voltage V2. However, the failure determination thresholds TH1 and TH3 may be predetermined fixed values.

In the control performed in the above embodiment, the open instruction signal is first input to the Nth relay and then the close instruction signal is input to the Nth relay. Then, the open instruction signal and the close instruction signal are input to the N+1th relay. However, the configuration of the controller 34 is not limited to such a configuration. The open instruction signal is first input to the N+1th relay and then the close instruction signal is input to the N+1th relay. Then, the open instruction signal and the close instruction signal are input to the Nth relay. Namely, the sequence to input the signals can be the other way around.

In the above embodiment, the battery protection device 3 includes two relays 31A and 31B. However, the configuration of the battery protection device 3 is not limited to such a configuration. The battery protection device 3 may include three or more relays.

In the above embodiments, the controller 34 selects one of two relays 31A and 31B at different time in sequence and inputs an open instruction signal to each relay 31A or 31B at the time when the relay 31A or 31B is selected. However, the controller 34 may be configured to select one of three relays at different time in sequence and to input an open instruction signal to each relay at the time when the relay is selected. If the battery protection device 3 includes four relays 31A to 31D, the controller 34 may be configured to select two relays 31A and 31B and to input open instruction signals thereto at the same time, and then, to select the rest of two relays 31C and 31D and to input open instruction signals thereto at the same time. If the battery protection device 3 includes three relays 31A to 31C, the controller 34 may be configured to select two relays 31A and 31B and to input open instruction signals thereto at the same time, and then to select the relays 31B and 31C and to input open instruction signals thereto at the same time, and then to select the relays 31C and 31A and to input open instruction signals thereto at the same time. Namely, it is preferable that the inputs of open instruction signals may be performed by selecting the specific number of switches including at least one switch different from the previously selected switches out of a plurality of switches (=K<M=the total number of switches) and inputting open instruction signals thereto so that the specific number of switches open at the same time and a different set of switches open at different time in sequence.

In the above embodiment, the relays 31A and 31B have substantially the same contact resistance. However, the configurations of the relays 31A and 31B are not limited to such configurations. The relays 31A and 31B may have different contact resistances.

In the above embodiment, if it is determined that the Nth relay has a failure, the controller 34 halts the open instruction signal input step, that is, does not input the open instruction signal to the N+1th relay. However, the configuration of the controller 34 is not limited to such a configuration. The controller 34 may be configured to input an open instruction signal to the N+1 th relay if it is determined that the Nth relay has a failure and to determine a switch failure when the open instruction signal input step is complete for all switches.

In the above embodiment, the current determination lower limit TH2 and the current determination upper limit TH4 are provided as an example of continue conditions. However, the continue conditions are not limited to such conditions. For example, a condition in which a temperature of the relay 31A or 31B or an ambient temperature is equal to or lower than a heat determination threshold may be used for the continue condition. The controller 34 may be configured to detect a temperature of the relay 31A or 31B based on a detection result provided by a temperature detector (not illustrated) and to determine discontinuation of the switch failure diagnosis process if the determined temperature exceeds the heat determination threshold.

What is claimed is:

1. A switch failure diagnosis device for using in a current path between an electric device and an electric storage device, the switch failure diagnosis device comprising:
    a plurality of switches connected parallel to each other in the current path between the electric device and the electric storage device;
    a switch terminal voltage detector configured to output a switch terminal voltage detection signal corresponding to a voltage across the switches; and
    a controller configured to:
        select the switches at different time in sequence and input an open instruction signal to each switch at a time when the switch is selected; and
        determine, based on the switch terminal voltage detection signal output while the open instruction signal is given, that at least one of the switches has a failure if the detected voltage is in a failure determination range.

2. The switch failure diagnosis device according to claim 1, wherein the controller is further configured to:
    determine whether the electric device is in an energized state or a non-energized state;
    determine whether at least one of the switches has a failure if the electric device is determined to be in the non-energized state; and
    input the open instruction signal to the switch and determine whether at least one of the switches has a failure if the electric device is determined to be in the energized state and no failure of switches is determined while the electric device is in the non-energized state.

3. The switch failure diagnosis device according to claim 2, wherein the switch terminal voltage detector includes an electric device-side voltage detector portion configured to output an electric device-side voltage detection signal corresponding to an electric device-side voltage that is a voltage between the electric device and the switches, and wherein the controller is further configured to:
input the open instruction signal to the switch if the electric device is determined to be in the non-energized state;
determine the electric device-side voltage based on the electric device-side voltage detection signal while the open instruction signal is given to the switch; and
determine that there is no failure of switch if the electric device-side voltage is equal to or higher than a failure determination threshold.

4. The switch failure diagnosis device according to claim 1, wherein the switch terminal voltage detector includes an electric device-side voltage detector portion and an electric storage device-side voltage detector portion, the electric device-side voltage detector portion being configured to output an electric device-side voltage detection signal corresponding to an electric device-side voltage that is a voltage between the electric device and the switches, the electric storage device-side voltage detector portion being configured to output an electric storage device-side voltage detection signal corresponding to an electric storage device-side voltage that is a terminal voltage of the electric storage device, and
wherein the controller is further configured to determine whether at least one of the switches has a failure based on a difference between the electric device-side detection signal and the electric storage device-side detection signal.

5. The switch failure diagnosis device according to claim 1, wherein the controller is further configured to:
halt the input of the open instruction signal to the switches without inputting the open instruction signal to an N+1th switch if at least one of the switches is determined to have a failure; and
select the N+1th switch and input the open instruction signal to the N+1 th switch if no failure of switches is determined,
where N refers to a positive integer equal to or larger than 1.

6. The switch failure diagnosis device according to claim 1, wherein the controller is further configured to:
determine whether a continue condition is satisfied; and
repeat the selecting of the switches and the inputting of the open instruction signal from the first switch if the continue condition is determined as not satisfied during the inputs of the open instruction signals to the switches.

7. The switch failure diagnosis device according to claim 1, wherein the current path comprises a plurality of current paths provided with the plurality of switches, respectively,
wherein the plurality of current paths comprises common connection points on an upstream side of the switches and on a downstream side of the switches, respectively, and
wherein the current paths have substantially the same resistance.

8. An electric storage apparatus, comprising:
an electric storage device; and
the switch failure diagnosis device according to claim 1.

9. The switch failure diagnosis device according to claim 1, wherein the electric device comprises at least one of a charger and a load.

10. The switch failure diagnosis device according to claim 1, wherein the switches are configured to change a state of the current path between a non-energized state and an energized state.

11. The switch failure diagnosis device according to claim 1, wherein the switches comprise contact relays.

12. The switch failure diagnosis device according to claim 1, wherein the switches comprise semiconductor switches.

13. The switch failure diagnosis device according to claim 1, wherein the switches comprise normally-closed type switches.

14. The switch failure diagnosis device according to claim 1, wherein the switch failure diagnosis device is configured for a vehicle.

15. The switch failure diagnosis device according to claim 1, wherein, when the switch failure diagnosis device is turned on, the controller is configured to select the switches.

16. The switch failure diagnosis device according to claim 1, wherein the controller is further configured to:
determine whether the electric device is in an energized state or a non-energized state; and
input the open instruction signal to the switch and determine whether at least one of the switches has a failure if the electric device is determined to be in the energized state and no failure of switches is determined while the electric device is in the non-energized state.

17. The switch failure diagnosis device according to claim 1, wherein the controller is further configured to:
determine whether at least one of the switches has a failure if the electric device is determined to be in a non-energized state; and
input the open instruction signal to the switch and determine whether at least one of the switches has a failure if the electric device is determined to be in an energized state and no failure of switches is determined while the electric device is in the non-energized state.

18. The switch failure diagnosis device according to claim 1, wherein the switch terminal voltage detector includes an electric device-side voltage detector portion and an electric storage device-side voltage detector portion, the electric device-side voltage detector portion being configured to output an electric device-side voltage detection signal corresponding to an electric device-side voltage that is a voltage between the electric device and the switches, the electric storage device-side voltage detector portion being configured to output an electric storage device-side voltage detection signal corresponding to an electric storage device-side voltage that is a terminal voltage of the electric storage device.

19. The switch failure diagnosis device according to claim 1, wherein the controller is configured to determine whether the failure of the at least one of the switches exists without shutting off the current path between the electric storage device and the electric device.

20. A failure diagnosis method, comprising:
connecting a plurality of switches parallel to each other in a current path between an electric device and an electric storage device;
outputting a switch terminal voltage detection signal corresponding to a voltage across the switches;
selecting the switches at different time in sequence and inputting an open instruction signal to each switch at a time when the switch is selected; and
determining, based on the switch terminal voltage detection signal output while the open instruction signal is given, that at least one of the switches has a failure if the detected voltage is in a failure determination range.

* * * * *